Sept. 20, 1971 J. P. SPRIDCO ET AL 3,605,260

METHOD OF MAKING MULTILAYER PRINTED CIRCUITS

Filed Nov. 12, 1968

INVENTORS
Jack P. Spridco &
Thomas A. Mancewicz
BY
Warren D. Hill

United States Patent Office 3,605,260
Patented Sept. 20, 1971

3,605,260
METHOD OF MAKING MULTILAYER PRINTED CIRCUITS

Jack P. Spridco, New Berlin, Wis., and Thomas A. Mancewicz, Lathrup Village, Mich., assignors to General Motors Corporation, Detroit, Mich.

Filed Nov. 12, 1968, Ser. No. 774,705
Int. Cl. H01b *5/14, 17/62;* H05k *3/06*
U.S. Cl. 29—625 2 Claims

ABSTRACT OF THE DISCLOSURE

In a method of making printed circuits a thick conductive sheet carried by a substrate is etched to form circuit pathways. The pathways are reduced in thickness by partial etching except certain portions whose thickness is preserved to form interconnections. The etched away portions are filled with insulating material and a second set of conductors are formed thereon connecting with the interconnection points.

Figures 1, 2, 3, 4, 5, 6:
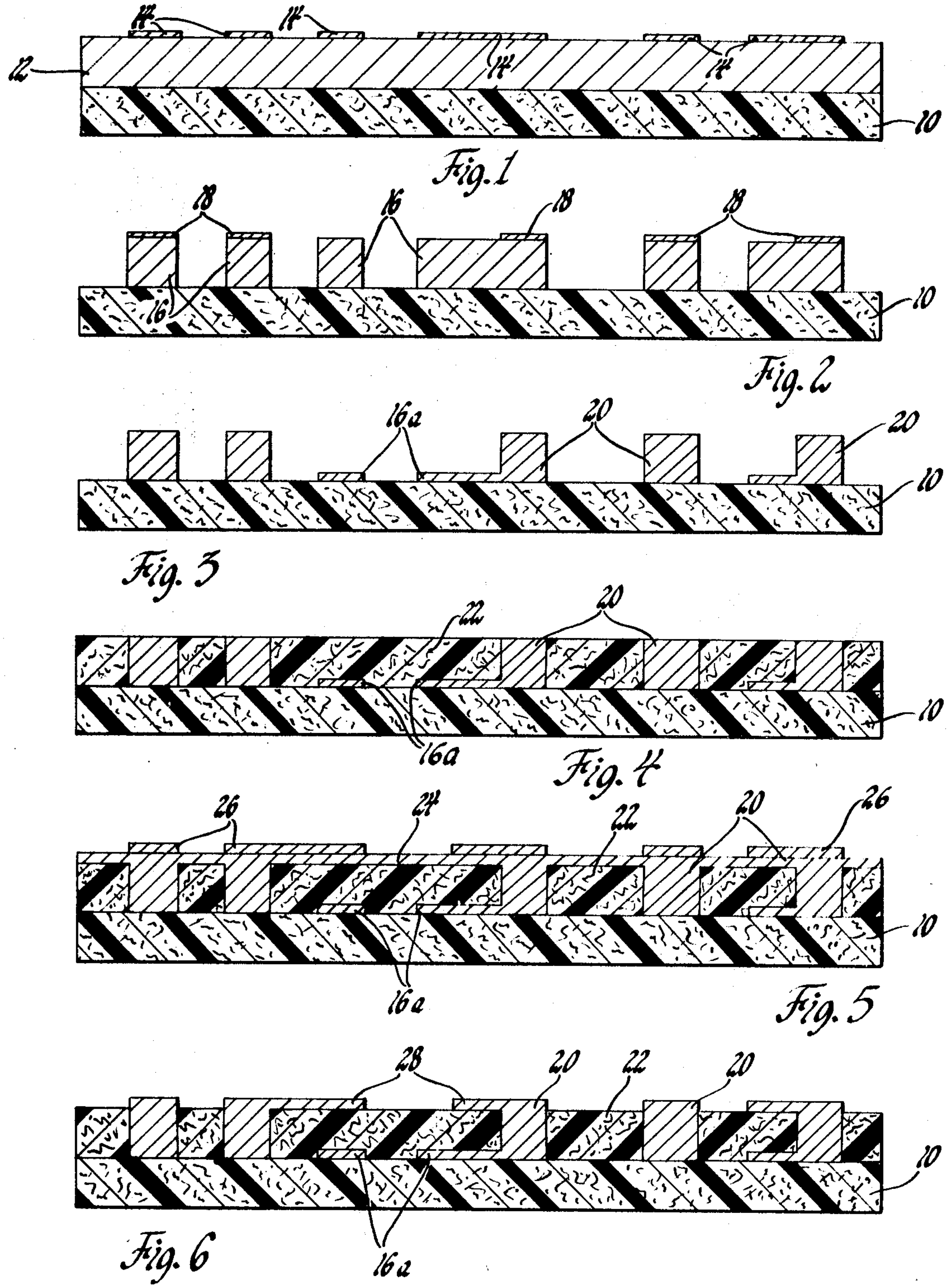

This invention relates to a method of making multilayer printed circuit boards and particularly to such a method wherein interconnections between several layers are accomplished without drilling or etching apertures in intermediate insulators.

It has been a common practice heretofore in making multilayer printed circuits to drill apertures in those insulating layers which separate conductor layers and then to form interconnection conductors through the apertures to connect certain circuit portions in different layers. While that technique has been satisfactory where only a few interconnections were required, it has become impractical where very large numbers of minute apertures are required.

It is a general object of this invention to provide a method of making a multiplayer printed circuit wherein it is unnecessary to drill apertures in circuit board insulators.

It is a further object of this invention to provide a method of making multilayer printed circuits wherein an insulator between circuit layers is formed around interconnection conductors after the interconnection conductors are formed.

The invention is carried out by forming circuit pathways from a thick conductive sheet carried by a substrate, reducing the thickness of the pathways except where interconnection conductors are desired, forming a layer of insulating material over the conductive pathways and around the interconnection conductors and forming on the insulating material another layer of conductive pathways connected to the first layer by interconnection conductors.

The above and other advantages will be made more apparent from the following specification taken in conjunction with the accompanying drawings wherein like reference numerals refer to like parts and wherein:

FIGS. 1–6 are cross-sectional views depicting the several stages of fabrication of a multilayer printed circuit in accordance with the method of this invention.

With reference to the drawings, an insulating substrate 10 laminated to a conductive sheet 12 is used as a starting material of this invention. The substrate 10 may be any of the well known insulating materials conventionally used for printed circuit boards. However, a glass cloth impregnated with epoxy material hereinafter referred to as glass-epoxy is preferred. Similarly, the conductive layer 12 may be any of the metals useful for printed circuits but for purposes of this description, copper is preferred. The thickness of the copper layer 12 must be substantially greater than that required for the finished circuit pathways. For example, where a thickness of 0.0005 inch is desired for the circuit pathways, a thickness of 0.005 inch for the copper layer 12 is adequate. The thickness of the glass-epoxy substrate may be any desired value although 0.005 inch has been found to be suitable.

As shown in FIG. 1, a pattern of resist material 14 is formed on the surface of the copper layer 12. The pattern of resist 14 is formed by conventional photoresist techniques. That is, a film of resist material which is photo-sensitive is applied to the copper layer 12 and is selectively hardened by being exposed to light through a negative transparency of the desired circuit pattern and the unexposed portions are washed away with a solvent. Those portions of the copper layer 12 unprotected by the pattern of resist 14 are completely removed by etching the copper with a suitable etchant such as ferric chloride thereby leaving on the substrate 10 a pattern of conductive circuit pathways 16. After the etching operation, the circuit board is washed with water and the resist 14 is removed. Then, as shown in FIG. 2, a pattern of resist 18 is applied to the circuit pathways 16 at the points where interconnection with a second circuit layer is desired. The circuit is etched in ferric chloride to reduce the thickness of the unprotected portions of the circuit pathways 16 to a thickness of 0.0005 inch or any other desired thickness.

As shown in FIG. 3, this operation results in thin horizontal disposed circuit pathway sections **16*a* with integral upstanding portions corresponding to the desired interconnection conductors 20 having the original thickness of the copper layer 12 thereby forming a plurality of generally L-shaped conductive members. The circuit board is again washed with water and the resist pattern 18 removed. The substrate 10 and the thin circuit pathways 16*a* are covered with insulating material 22 up to the top surfaces of the interconnection conductors 20. The insulating material 22 is preferably a fluid such as a liquid or paste comprised of glass fibers chopped into short lengths and mixed with a liquid epoxy. After application, the epoxy is allowed to cure or harden. It is desired that the hardened insulating material 22 be flush with the top of the interconnection conductors 20 so that if necessary the insulating material 22 is reduced to the required level by sanding or grinding. To avoid grinding or sanding the insulating material 22, it is preferred to apply the material 22 to the circuit board by placing over the circuit board a mold having a flat inner surface in contact with the top surface of the interconnection conductors 20 and injecting under pressure the fluid insulating material onto the substrate 10 and circuit pathways 16*a***.

Then, a 0.0005 inch layer 24 of copper is deposited on the circuit board covering both the insulating material 22 and the interconnection conductors 20. Conventional methods of applying a conductive coating to an insulating material are well known. A preferred method comprises abrading or etching the surface of the insulating material 22 to roughen the surface, seeding the surface to make it conductive and then electroplating the desired amount of metal onto the material 22. The seeding process comprises immersing the circuit board in a stannous chloride solution to deposit a small amount of tin on the material 22, rinsing in water, immersing in a palladium chloride solution to replace the tin with palladium, rinsing again with water, and depositing electroless copper to a thickness of, say, 10 micro-inches by immersing the board in a copper sulphate-Rochelle salt solution. The copper layer 24 is then completed by electroplating copper onto the electroless copper coating.

A second layer of circuit pathways is formed from the layer 24 of copper by applying a pattern of resist 26 to define the desired conductor pathways and the board is again etched in ferric chloride to remove the unprotected portion of the copper layer 24 thereby forming a plurality of generally C-shaped conductive members. Finally, the circuit board is washed again and the resist 26 is removed leaving the completed two layer circuit board having the horizontally disposed conductors 16*a* on the first layer seperated from the conductors 28 on the second layer by the glass-epoxy insulating material 22 with connections therebetween being made by the interconnecting upstanding conductors 20.

If desired, additional circuit layers may be fabricated by making the deposited layer of copper 24 0.005 inch thick and then repeating the process for each additional circuit layer desired.

It will be readily apparent that the method of this invention permits the fabrication of a multilayer circuit board with interconnections between the several circuit layers without requiring drilling of apertures in an intervening insulator. It is also apparent that the principle of this method is applicable to many materials not specifically set forth herein and also that other techniques not mentioned, e.g., for applying resist patterns and for applying the insulating material 22, may be utilized.

The embodiment of the invention described herein is for purposes of illustration and the scope of the invention is intended to be limited only by the following claims:

It is claimed:

1. The method of making a multilayer printed circuit with interconnection conductors between the layers comprising the steps of providing an initially fluid glass-epoxy substrate and covering it with a thick layer of conductive material, removing undesired portions of the conductive material through the entire thickness of the conductive material to form a set of conductive isolated pathways, protecting selected areas of the conductive pathways where interconnections are desired, reducing the thickness of the unprotected portions of the conductive pathways, thereby providing a plurality, of generally in elevational cross-section, L-shaped, conductive members forming interconnection conductors at the protected areas, forming over the substrate and the conductive pathways of reduced thickness a layer of fluid glass-epoxy material leaving the surface of the interconnection conductors exposed, and hardening the glass-epoxy material, depositing a layer of conductive material over the layer of glass-epoxy material and interconnection conductors, and removing undesired portions of the deposited layer of conductive material to form a plurality, of generally in elevational cross-section, C-shaped, conductive members thereby providing a second set of conductive upstanding pathways connected to the first set by the interconnection conductors.

2. The method of making a multilayer printed circuit with interconnection conductors between the layers comprising the steps of providing an initially fluid glass-epoxy substrate and covering it with a thick copper sheet secured to one side, forming a pattern of etch resist material on the copper sheet to define desired conductive pathways, completely etching away the exposed portions of the copper sheet to form the desired conductive pathways and removing the resist material, forming a second pattern of resist material on the conductive pathways to define desired interconnection conductors, partly etching away the exposed portions of the conductive pathways to reduce the thickness thereof to form generally in elevational cross-section, L-shaped, conductive members, and removing the resist material to expose the interconnection conductors, filling the etched away areas with fluid glass-epoxy insulator and allowing the insulator to harden, plating onto the insulator and the interconnection conductors a layer of copper, forming a third pattern of resist material defining circuit pathways including the interconnection conductors on the plated layer of copper, completely etching away the portions of the copper layer not protected by resist, and then removing the resist, thereby forming a plurality, of generally in elevational cross-section, C-shaped, conductive members thereby providing spaced layers of pathways with interconnection conductors.

References Cited

UNITED STATES PATENTS

| | | | |
|---|---|---|---|
| 3,462,832 | 8/1969 | Kubik | 29—625 |
| 3,483,615 | 12/1969 | Gottfried | 29—625 |
| 3,488,429 | 1/1970 | Boucher | 29—625X |
| 3,471,631 | 10/1969 | Quintana | 29—625X |
| 3,508,325 | 4/1970 | Perry | 29—625X |
| 3,528,048 | 9/1970 | Kirk | 29—625X |
| 3,544,287 | 12/1970 | Sharp | 29—625X |

OTHER REFERENCES

Peter, A. E., et al.: "Multilayer Circuit Fabrication"; IBM Technical Disclosure Bulletin, vol. 10, No. 4, September 1967; pp. 359–360.

WAYNE A. MORSE, Jr., Primary Examiner

U.S. Cl. X.R.

29—631